United States Patent
Mao

(10) Patent No.: US 9,282,672 B2
(45) Date of Patent: Mar. 8, 2016

(54) SECURING MECHANISM AND ELECTRONIC DEVICE CASE COMPRISING THE SAME

(71) Applicant: Wistron Corporation, New Taipei (TW)

(72) Inventor: Zhong-Hui Mao, New Taipei (TW)

(73) Assignee: Wistron Corporation, New Taipei (TW)

(*) Notice: Subject to any disclaimer, the term of this patent is extended or adjusted under 35 U.S.C. 154(b) by 220 days.

(21) Appl. No.: 14/247,495

(22) Filed: Apr. 8, 2014

(65) Prior Publication Data

US 2015/0136436 A1 May 21, 2015

(30) Foreign Application Priority Data

Nov. 18, 2013 (CN) .......................... 2013 1 0583253

(51) Int. Cl.
*H05K 5/02* (2006.01)
*H05K 5/04* (2006.01)
*H05K 7/14* (2006.01)
*H05K 5/00* (2006.01)

(52) U.S. Cl.
CPC ............ *H05K 7/1487* (2013.01); *H05K 5/0013* (2013.01); *Y10T 403/608* (2015.01)

(58) Field of Classification Search
CPC ........... H02G 3/08; H02G 3/081; H02G 3/14; H05K 5/00; H05K 5/0004; H05K 5/02; H05K 5/0208; H05K 5/0217; H05K 5/0247; H05K 5/03; H05K 7/1487; H05K 5/0013; Y10T 403/608
USPC ........... 174/50, 559, 560, 561, 62, 563, 17 R, 174/66, 675; 220/3.2, 3.3, 4.02; 312/223.1, 312/223.2; 361/600, 601, 679.02, 679.57, 361/679.58, 724, 752
See application file for complete search history.

(56) References Cited

U.S. PATENT DOCUMENTS

| | | | | |
|---|---|---|---|---|
| 5,510,957 A * | 4/1996 | Takagi | ................... | H04B 1/082 174/50 |
| 6,288,336 B1 * | 9/2001 | Chen | ....................... | G06F 1/181 174/50 |
| 6,555,747 B2 * | 4/2003 | Chen | ....................... | H05K 7/18 361/679.57 |
| 7,164,080 B2 * | 1/2007 | Chen | ....................... | G06F 1/181 174/50 |
| 7,166,799 B2 * | 1/2007 | Chen | ....................... | G06F 1/181 174/50 |
| 7,253,360 B2 * | 8/2007 | Chen | ....................... | G06F 1/181 174/50 |
| 7,265,971 B2 * | 9/2007 | Chen | ....................... | G06F 1/181 174/50 |
| 8,908,381 B2 * | 12/2014 | Miyazaki | ............. | H05K 5/0247 174/50 |

* cited by examiner

*Primary Examiner* — Angel R Estrada
(74) *Attorney, Agent, or Firm* — Whyte Hirschboeck Dudek S.C.

(57) ABSTRACT

A securing mechanism includes a first securing unit fixedly disposed on a first component of an electronic device case, and a second securing unit fixedly disposed on a second component for securing the second component to the first component in a first direction. The first securing unit includes a fixture board, a limiting structure and a biasing structure. When the second securing unit extends in the first direction through an engaging through hole in the fixture board, the biasing structure biases the second securing unit in a second direction opposite to the first direction, and the second securing unit engages the limiting structure. As a result, movement of the second securing unit in a direction toward the engaging through hole is limited.

22 Claims, 12 Drawing Sheets

SECURING MECHANISM AND ELECTRONIC DEVICE CASE COMPRISING THE SAME

CROSS-REFERENCE TO RELATED APPLICATION

This application claims priority of Chinese Application No. 201310583253.1, filed on Nov. 18, 2013, the disclosure of which is incorporated herein by reference.

BACKGROUND OF THE INVENTION

1. Field of the Invention

The invention relates to a securing mechanism and an electronic device case that includes the securing mechanism.

2. Description of the Related Art

A general electronic device, such as a host of a network server, is typically enclosed using an electronic device case. The electronic device case includes a metal housing that defines a space for retaining components of the electronic device, a plastic panel, and a plurality of securing mechanisms for securing the plastic panel to the metal housing. As shown in FIG. 1, a conventional electronic device case 1 includes a metal housing 11, a plastic panel 12 and a plurality of securing mechanisms 13 (only one securing mechanism 13 is depicted). Each of the securing mechanisms 13 includes an engaging through hole 131, a positioning through hole 132, an engaging hook 133, and a positioning member 134. The engaging through hole 131 and the positioning through hole 132 are formed in the metal housing 11, and the engaging hook 133 and the positioning member 134 are fixedly disposed on the plastic panel 12.

The engaging hook 133 is made of an elastic material and is formed with a head part 135 at one end. When it is to secure the plastic panel 12 to the metal housing 11, the engaging hook 133 is inserted into the engaging through hole 131. The elastic engaging hook 133 first elastically deforms so as to allow the head part 135 to extend through the engaging through hole 131, and then restores to the original shape so as to engage a side of the engaging through hole 131. Additionally, the positioning member 134 is inserted into the positioning through hole 132 so as to position the plastic panel 12 relative to the metal housing 11.

However, such a configuration utilizes mainly the restoration force of the elastic engaging hook 133 to keep the engaging hook 133 engaged with the engaging through hole 131. As a result, an external impact on the plastic panel 12 may undesirably deform and dislodge the engaging hook 133 from the engaging through hole 131. In addition, the engaging hook 133 only engages one side of the engaging through hole 131, and therefore, requiring inclusion of the positioning member 134 and the positioning through hole 132 to assist the positioning of the plastic panel 12 relative to the metal housing 11.

Moreover, when it is to disengage the plastic panel 12 from the metal housing 11, the elastic head part 135 must be pushed from inside the metal housing 11 to remove the engaging hook 133 from the side of the engaging through hole 131. Since each of the securing mechanisms 13 must be separately operated to complete the disengagement, the entire operation may be somewhat time-consuming and inconvenient. An addition drawback is that the engaging hook 133 may exhibit elastic fatigue after repeated use, and may experience fracture as a result, rendering the engaging hook 133 unusable. Therefore, there may still be room for improvement on the securing mechanisms 13 of the conventional electronic device case 1.

SUMMARY OF THE INVENTION

Therefore, one object of the present invention is to provide a securing mechanism that can alleviate at least some of the aforementioned drawbacks.

Accordingly, a securing mechanism of the present invention is configured to removably secure, to a first component, a second component in a first direction. The securing mechanism comprises a first securing unit and a second securing unit.

The first securing unit is to be fixedly disposed on the first component, and includes a fixture board, a limiting structure and a biasing structure.

The fixture board is to be fixedly attached to the first component, and has a first surface facing the second component in use, and a second surface opposite to the first surface and formed with an engaging through hole. The engaging through hole has an insertion part and an engaging part in spatial communication with each other, the engaging part having a width smaller than that of the insertion part. The limiting structure is formed on the second surface of the fixture board.

The second securing unit is to be fixedly disposed on the second component and includes an extending part and a head part.

The extending part is to extend from the second component in the first direction, and has a width corresponding with that of the engaging part of the engaging through hole.

The head part is disposed on a distal end of the extending part and has a width larger than the width of the engaging part and smaller than that of the insertion part.

When the extending part extends through the insertion part of the engaging through hole and is inserted into the engaging part of the engaging through hole, the biasing structure biases the second securing unit in a second direction opposite to the first direction and away from the first component, and the head part engages the limiting structure, thereby limiting movement of the head part in a direction toward the insertion part.

Another object of the present invention is to provide an electronic device case that includes the securing mechanism of the present invention.

Accordingly, an electronic device case of the present invention includes a first component, a second component, and at least one securing mechanism for removably securing the second component to the first component in a first direction.

The securing mechanism includes a first securing unit and a second securing unit.

The first securing unit is fixedly disposed on the first component, and includes a fixture board, a limiting structure and a biasing structure.

The fixture board is fixedly attached to the first component, and has a first surface facing the second component, and a second surface opposite to the first surface. The second surface is formed with an engaging through hole having an insertion part and an engaging part in spatial communication with each other. The engaging part has a width smaller than that of the insertion part. The limiting structure is formed on the second surface of the fixture board.

The second securing unit is fixedly disposed on the second component, and includes an extending part and a head part.

The extending part extends from the second component in the first direction, and has a width corresponding with that of the engaging part of the engaging through hole.

The head part is disposed on a distal end of the extending part and has a width larger than the width of the engaging part and smaller than that of the insertion part.

When the extending part extends through the insertion part of the engaging through hole and is inserted into the engaging part of the engaging through hole, the biasing structure biases the second securing unit in a second direction opposite to the first direction and away from the first component, and the head part engages the limiting structure, thereby limiting movement of the head part in a direction toward the insertion part.

BRIEF DESCRIPTION OF THE DRAWINGS

Other features and advantages of the present invention will become apparent in the following detailed description of the embodiment with reference to the accompanying drawings, of which.

DETAILED DESCRIPTION OF THE EMBODIMENT

Figure 2:
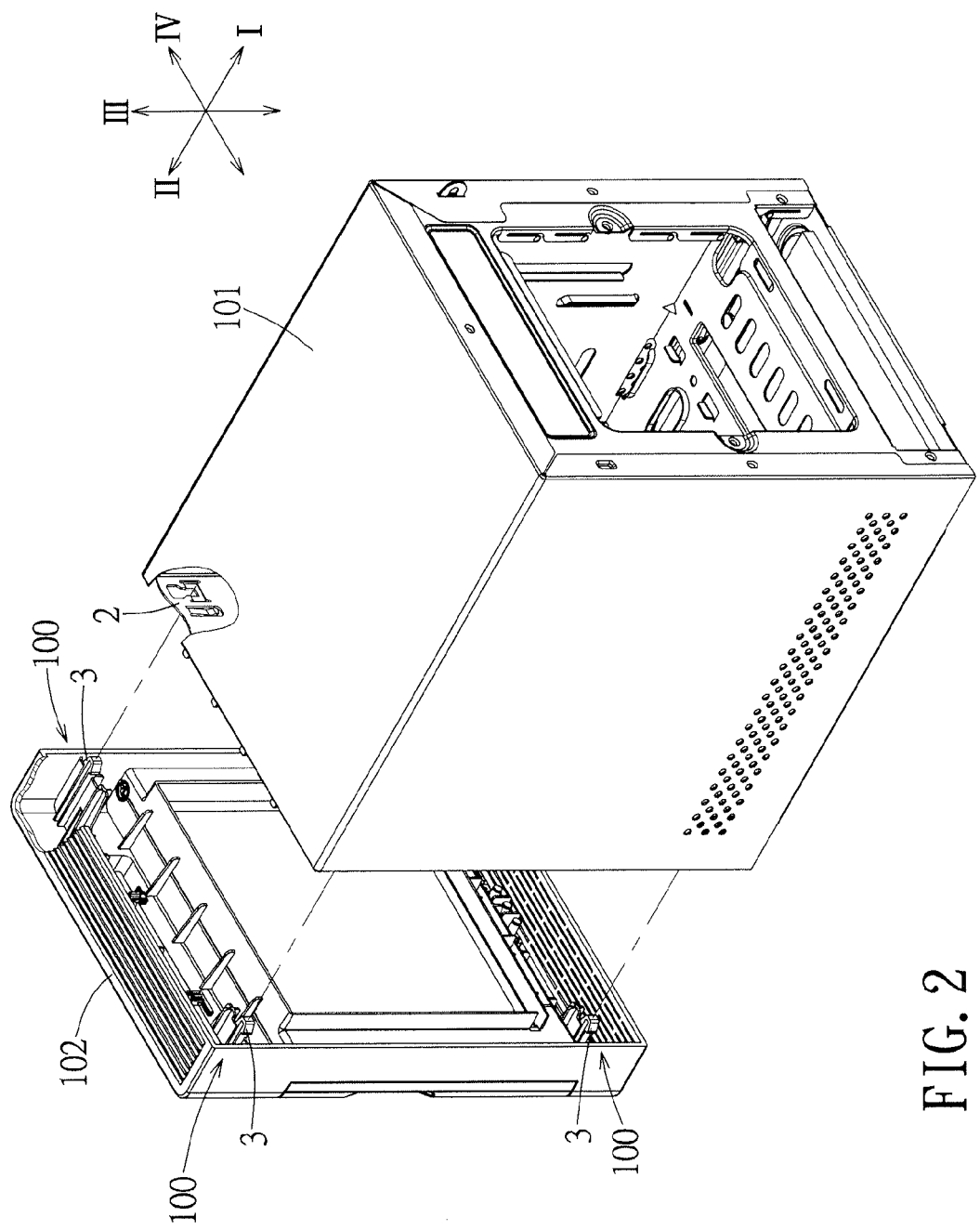
FIG. 2 is an exploded partly-cutaway perspective view of an embodiment of an electronic device case according to the invention.

As shown in FIG. 2, the embodiment of an electronic device case according to the present invention includes a first component 101, a second component 102, and four securing mechanisms 100 (only three are depicted) for removably securing the second component 102 to the first component 101 in a first direction (I).

The securing mechanisms 100 allow the second component 102 to be removed from the first component 101 in a second direction (II) that is opposite to the first direction (I). In this embodiment, the first component 101 may be a metal housing of a server host, and the second component 102 may be a plastic panel of the server host. Since each of the securing mechanisms 100 is identical to one another in structure, the description hereinafter will focus on only one of the securing mechanisms 100 for the sake of brevity.

Figure 3:
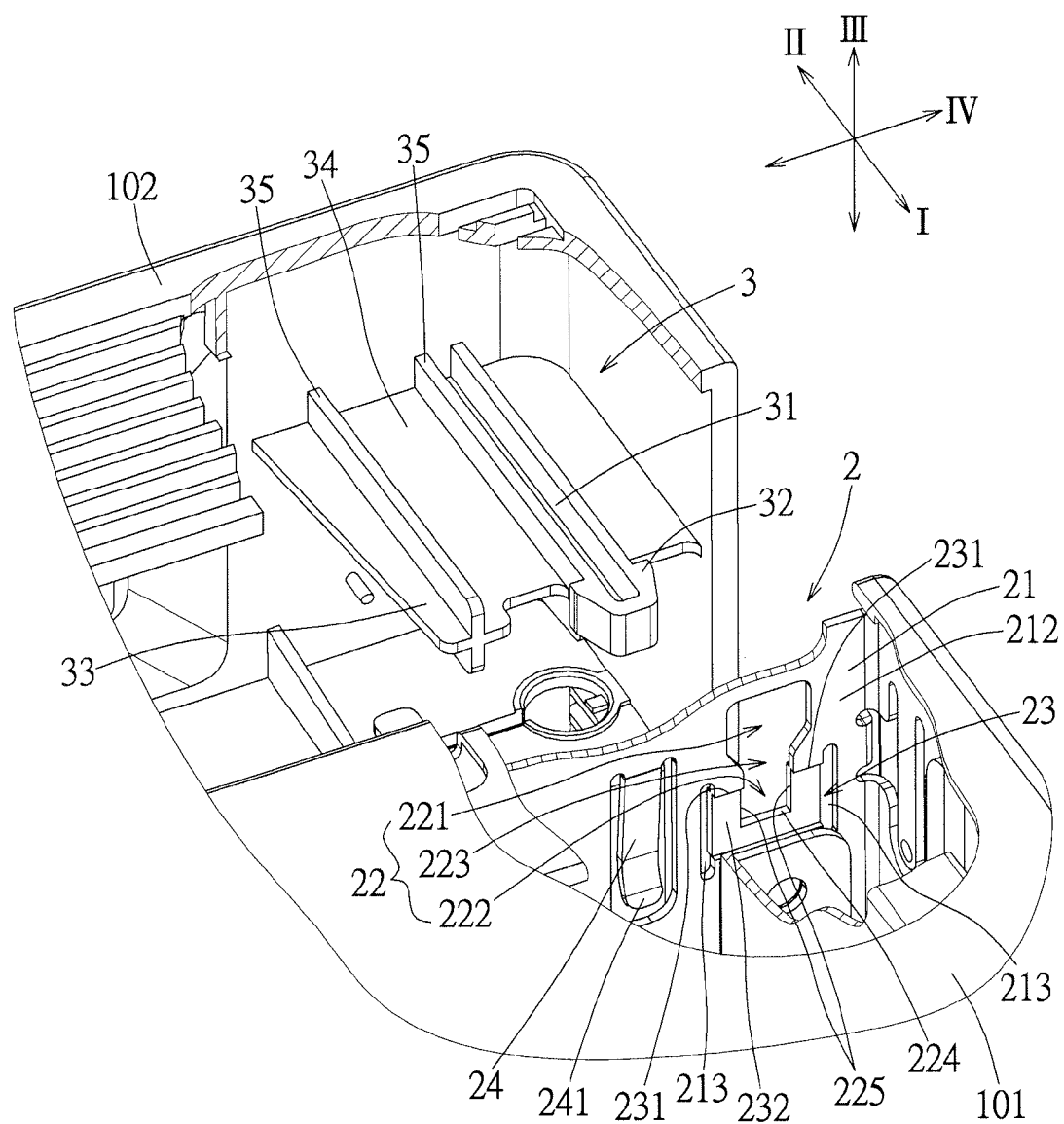
FIG. 3 is a fragmentary partly-cutaway perspective view of a securing mechanism of the electronic device case, illustrating a first securing unit disengaged from a second securing unit.
Figure 4:
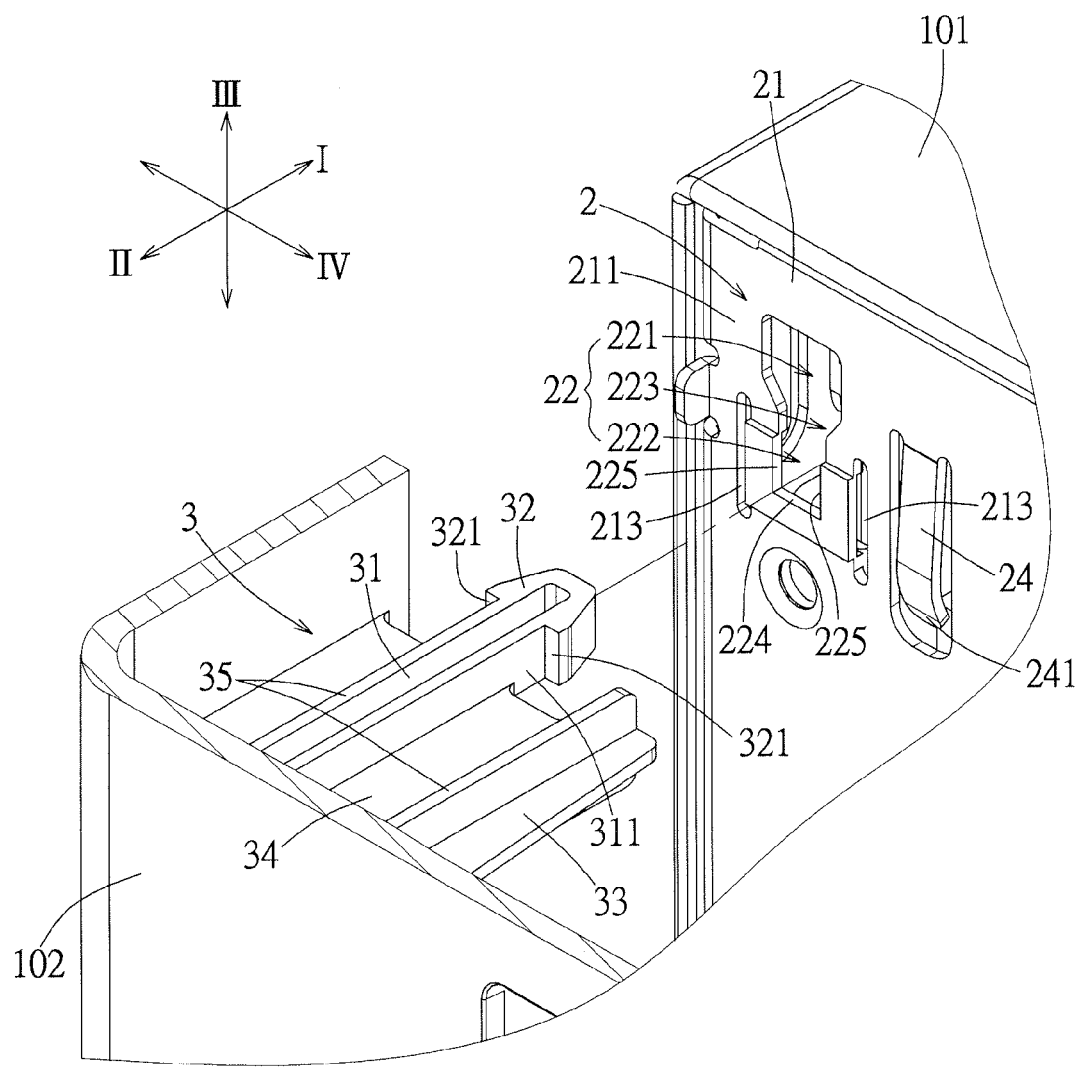
FIG. 4 is a fragmentary perspective view of the securing mechanism, from a different view angle.
Figure 5:
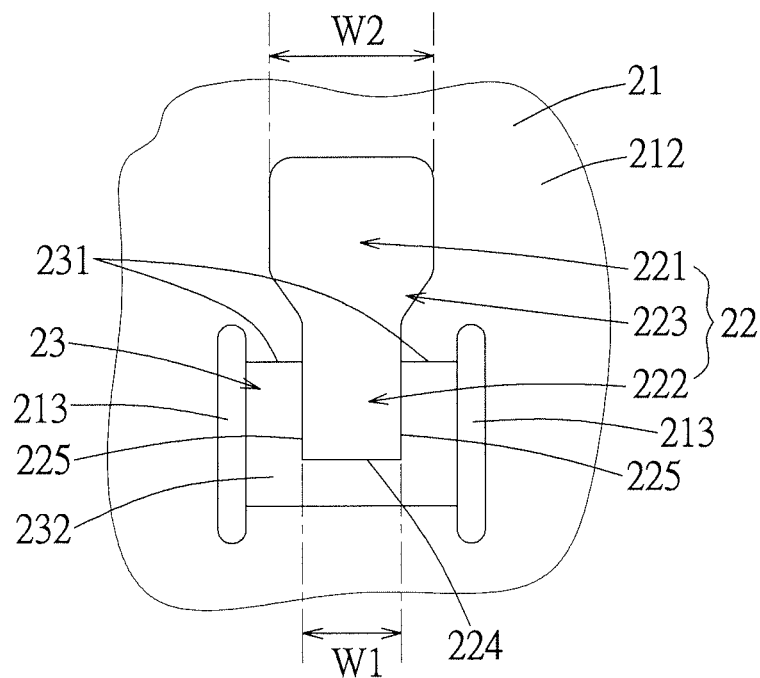
FIG. 5 is a front view illustrating an engaging through hole formed in the first securing unit of the securing mechanism.

Referring to FIGS. 3 to 5, the securing mechanism 100 includes a first securing unit 2 fixedly disposed on the first component 101, and a second securing unit 3 fixedly disposed on the second component 102. The first securing unit 2 includes a fixture board 21 that is formed with an engaging through hole 22, a limiting structure 23 that is formed on the fixture board 21, and a biasing structure 24 that is connected to the first component 101 through the fixture board 21. The fixture board 21 is fixedly attached to the first component 101, and has a first surface 211 facing the second component 102, and a second surface 212 opposite to the first surface 211. The engaging through hole 22 has an insertion part 221, an engaging part 222 and a neck part 223. The insertion part 221, the neck part 223 and the engaging part 222 are disposed in the given order, and are in spatial communication with one another in a third direction (III) that is perpendicular to the first direction (I) and the second direction (II). The engaging part 222 is formed to have a width (W1) smaller than a width (W2) of the insertion part 221, and a width of the neck part 223 reduces gradually from the insertion part 221 toward the engaging part 222. The engaging part 222 defines an abutting edge 224 at an end distal from the insertion part 221, and a pair of parallel side edges 225 connected respectively to opposite ends of the abutting edge 224. The abutting edge 224 is perpendicular to the third direction (III), and the side edges 225 extend in and are parallel to the third direction (III).

The limiting structure 23 is formed on the second surface 212 of the fixture board 21, is adjacent to the engaging part 222 of the engaging through hole 22, and has a pair of stepped structures 231 and a first abutting surface 232. Each of the stepped structures 231 is disposed at a respective one of opposite sides of the engaging part 222, and is parallel to the abutting edge 224. The first abutting surface 232 is parallel to the fixture board 21. Specifically, in this embodiment, the limiting structure 23 is a recess formed on the second surface 212, such that the limiting structure 23 may be relatively easier to form using a stamping process. It is noted that, the fixture board 21 may be formed with a pair of grooves 213 penetrating therethrough at opposite sides of the limiting structure 23, respectively. The presence of the grooves 213 may prevent undesirable irregular rumples/wrinkles from occurring in parts of the fixture board 21 adjacent to the limiting structure 23 during the stamping process used to form the limiting structure 23. The biasing structure 24 may be a spring plate that extends in the third direction (III), and is spaced apart from the engaging through hole 22 in a fourth direction (IV) perpendicular to the first, second and third directions (I, II, III). The biasing structure 24 may be made of an elastic material, and can elastically deform in the first and second directions (I, II).

Figure 6:
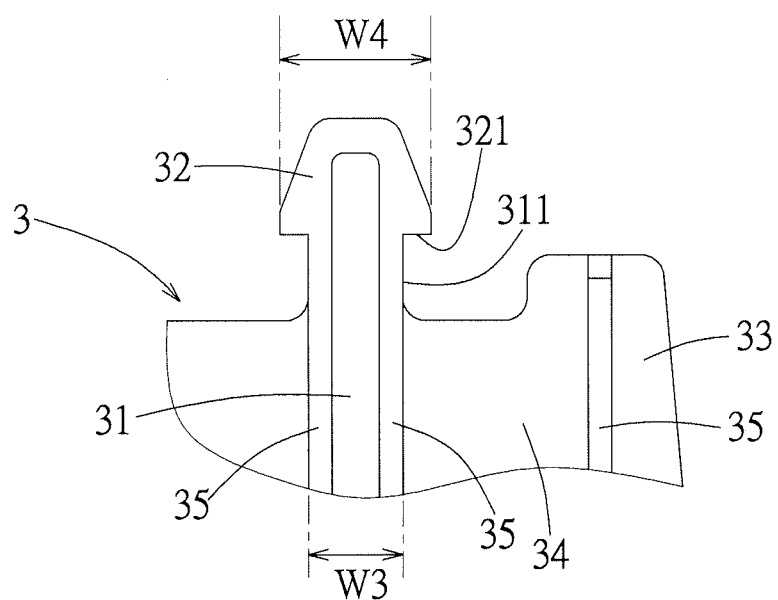
FIG. 6 is a top view illustrating the second securing unit of the securing mechanism.

Further referring to FIG. 6, the second securing unit 3 of the securing mechanism 100 is fixedly disposed on the second component 102, and includes an extending part 31, a head part 32, a pressing structure 33 and an enforcing board 34. The extending part 31 extends from the second component 102 in the first direction (I), and has a width (W3) corresponding with the width (W1) of the engaging part 222 of the engaging through hole 22. The extending part 31 has a pair of side surfaces 311 for abutting respectively against the side edges 225. The head part 32 is disposed on a distal end of the extending part 31, and is in the form of a trapezoid. That is, a width of the head part 32 gradually reduces in the first direction (I). A widest portion of the head part 32 has a width (W4) that is larger than the width (W1) of the engaging part 222 and smaller than the width (W2) of the insertion part 221. The head part 32 has a pair of second abutting surfaces 321 proximate to and confronting the extending part 31. The second abutting surfaces 321 abut against the first abutting surface 232 when the head part 32 engages the limiting structure 23. The pressing structure 33 extends from the second component 102 in the first direction (I), and is configured to be biased by the biasing structure 24 in the second direction (II). The enforcing board 34 interconnects the extending part 31 and the pressing structure 33. Each of the extending part 31 and the pressing structure 33 includes a plurality of enforcing ribs 35 extending in the first direction (I) for enhancing the structural strength of the second securing unit 3.

Figure 7:
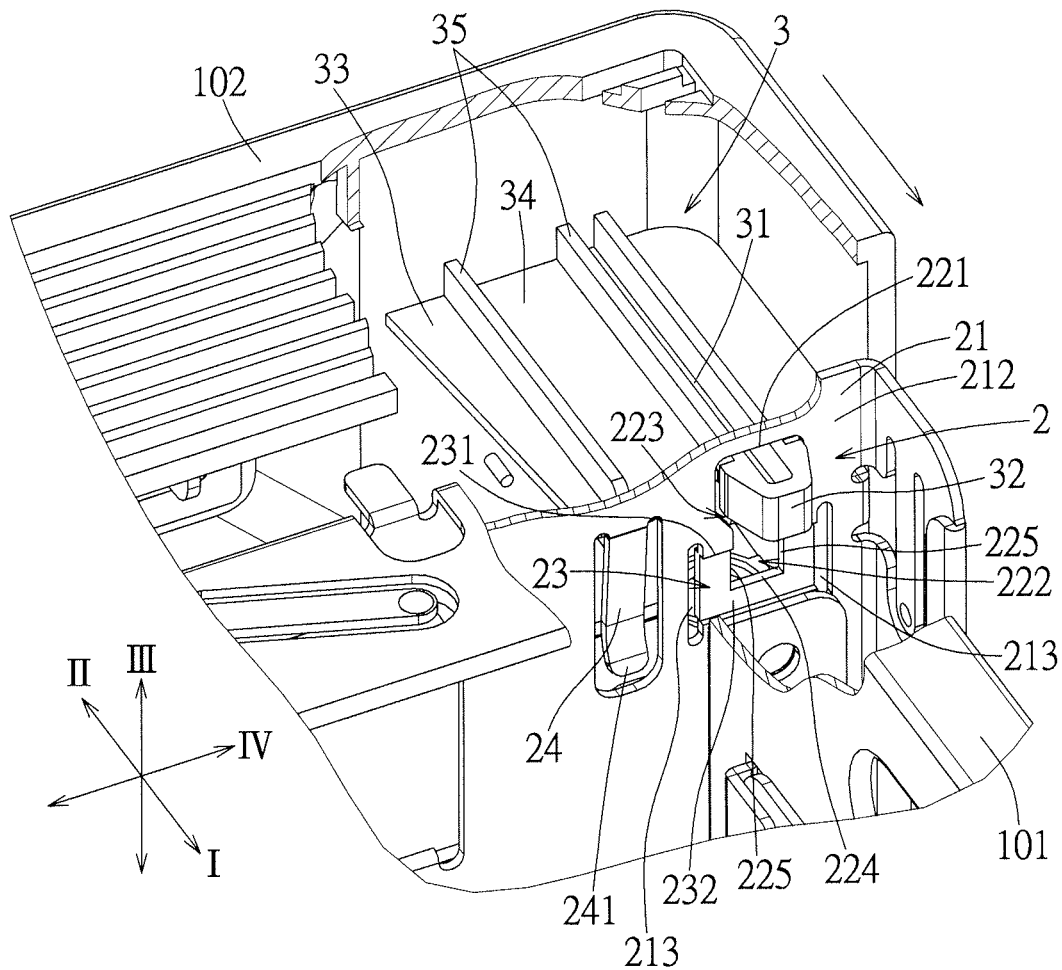
FIG. 7 is a fragmentary partly-cutaway perspective view illustrating a head part of the second securing unit extending through the engaging through hole.
Figure 8:
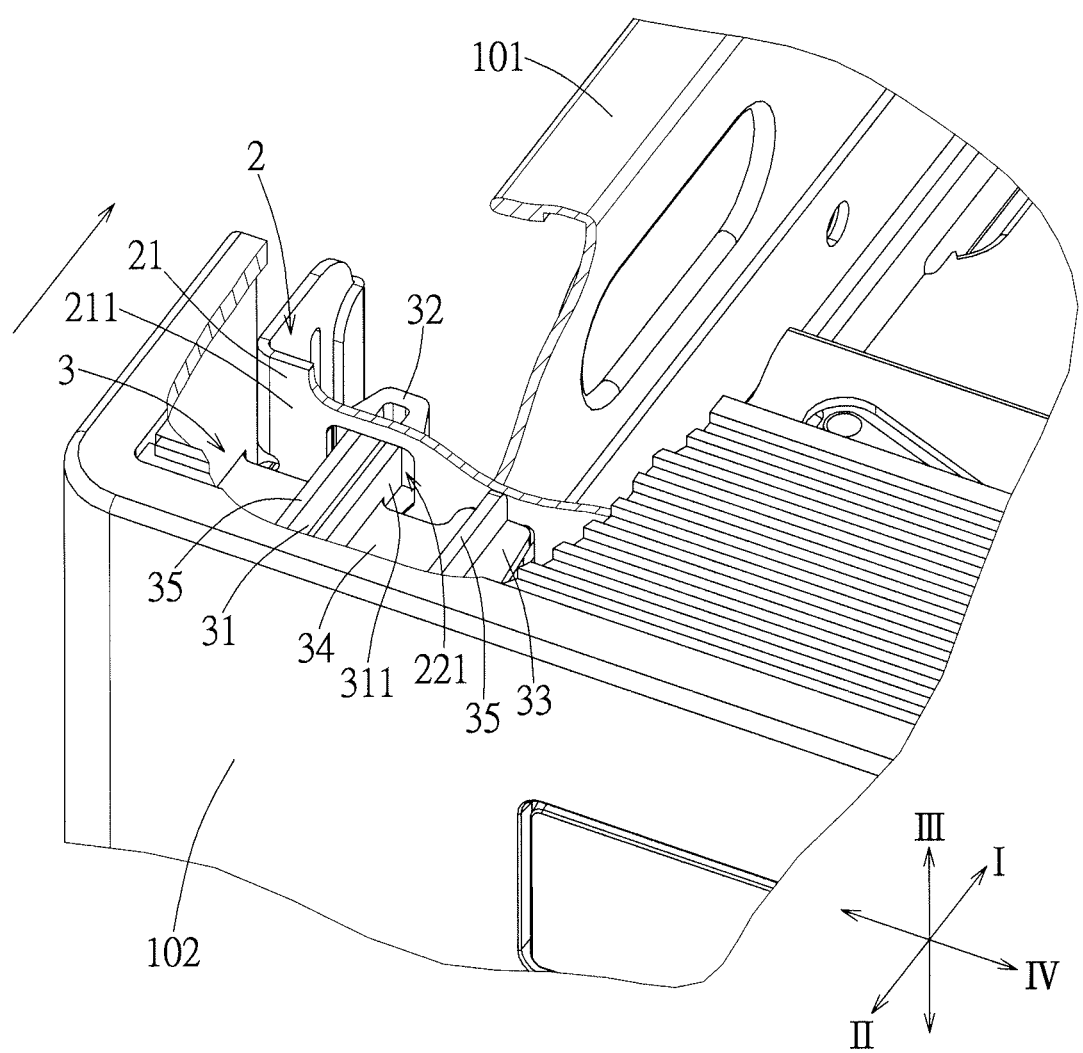
FIG. 8 is a fragmentary partly-cutaway perspective view illustrating the operation of FIG. 7 from a different view angle.

Referring to FIGS. 4, 7 and 8, when it is to secure the second component 102 to the first component 101, the second component 102 is moved (for example, by a user) toward the first component 101 in the first direction (I). Subsequently, the head part 32 and then a portion of the extending part 31 of the second securing unit 3 extend through the engaging through hole 22 (i.e., the insertion part 221) in the fixture board 21. Meanwhile, the pressing structure 33 presses against the biasing structure 24 in the first direction (I), causing the biasing structure 24 to elastically deform. In turn, the biasing structure 24 generates a biasing force against the pressing structure 33 in the second direction (II).

Figure 9:
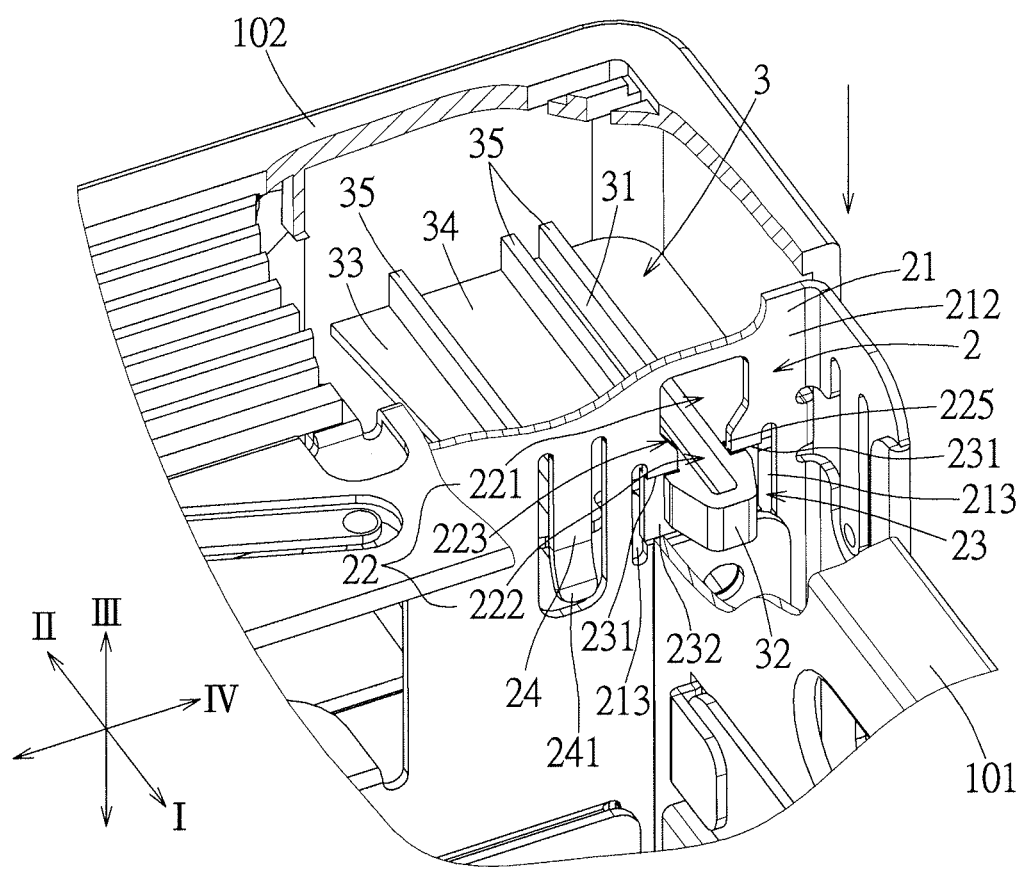
FIG. 9 is a fragmentary partly-cutaway perspective view illustrating the second securing unit moved to an engaging part of the engaging through hole.
Figure 10:
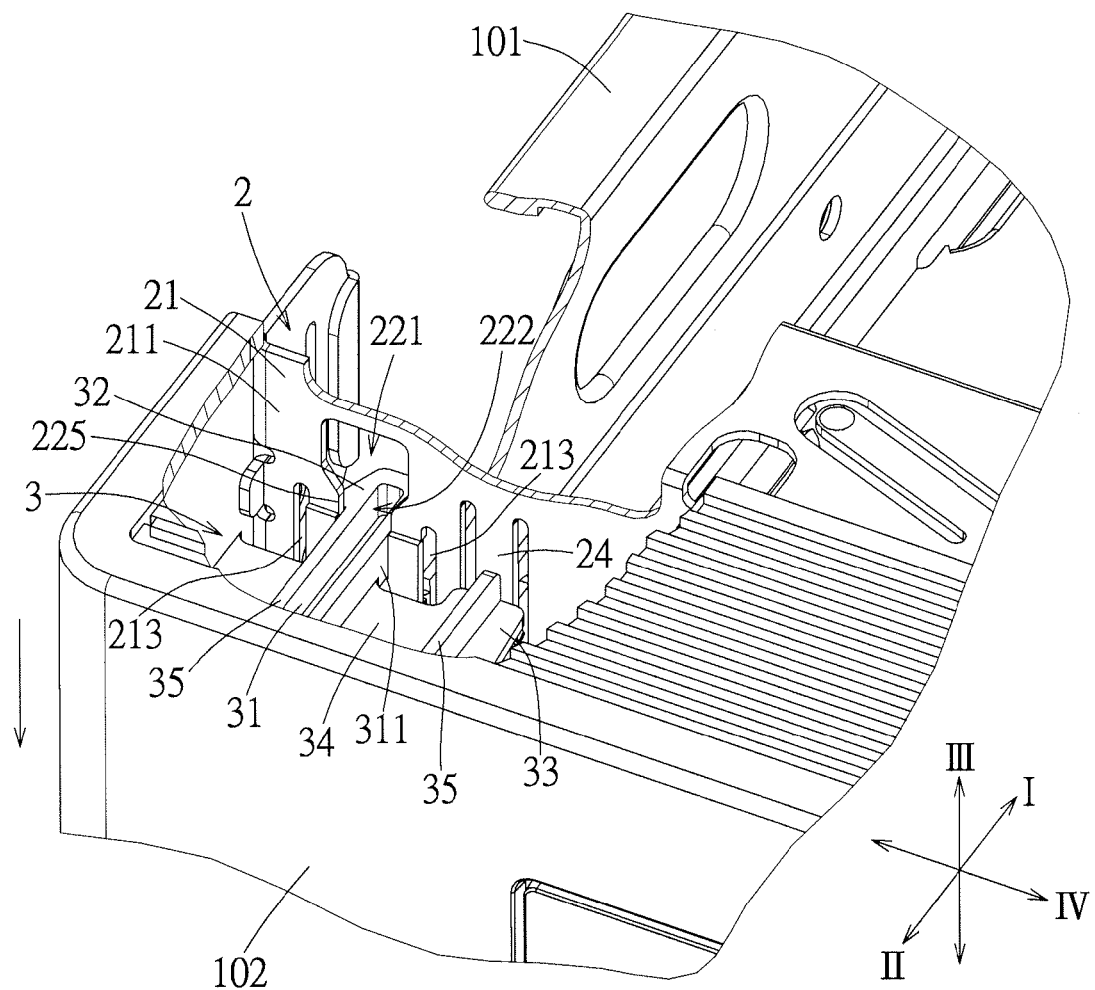
FIG. 10 is a fragmentary partly-cutaway perspective view illustrating the operation of FIG. 9 from a different view angle.
Figure 11:
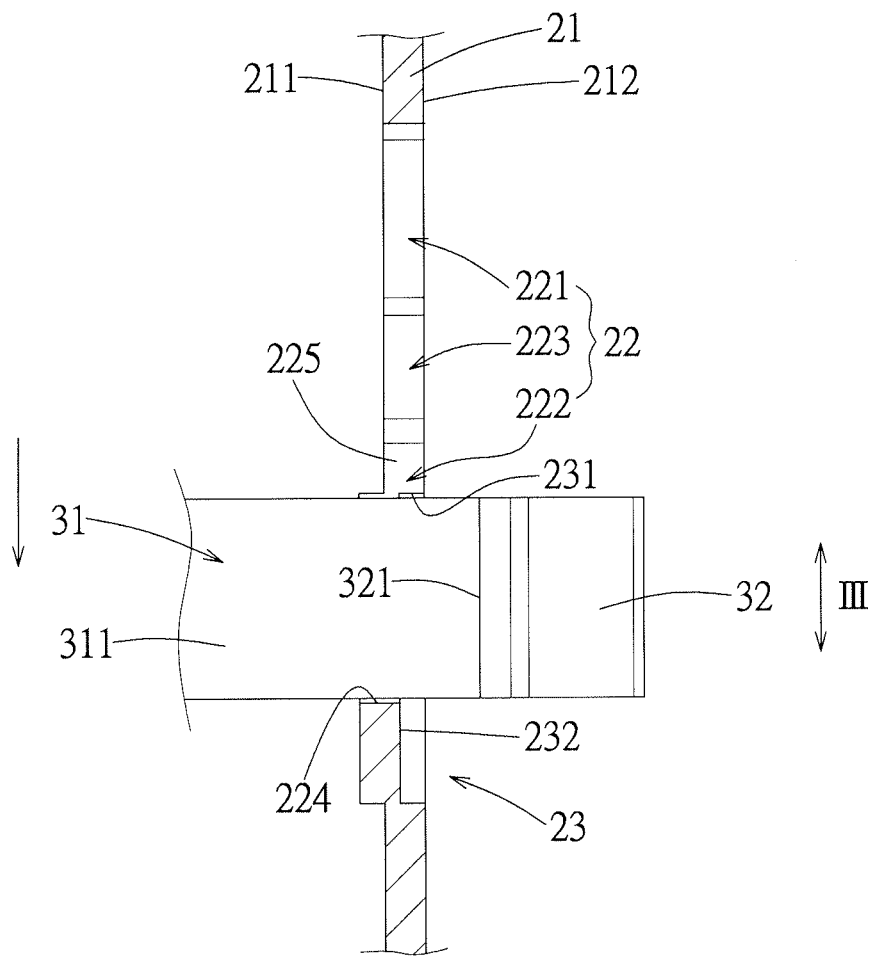
FIG. 11 is a fragmentary, partly-sectional view illustrating the operation of FIG. 9.

Afterward, as shown in FIGS. 9 to 11, the second component 102 is moved downwardly (for example, by the user) in the third direction (III). As a result, a portion of the extending part 31 that is at the insertion part 221 is moved to the engaging part 222 through the neck part 223, for abutting against the abutting edge 224. Moreover, the side surfaces 311 (only one is depicted in FIG. 4) of the extending part 31 abut respectively against the side edges 225 (see FIG. 3). In this way, movement of the second component 102 in the fourth direction (IV) relative to the first component 101 can be prohibited.

Figure 12:
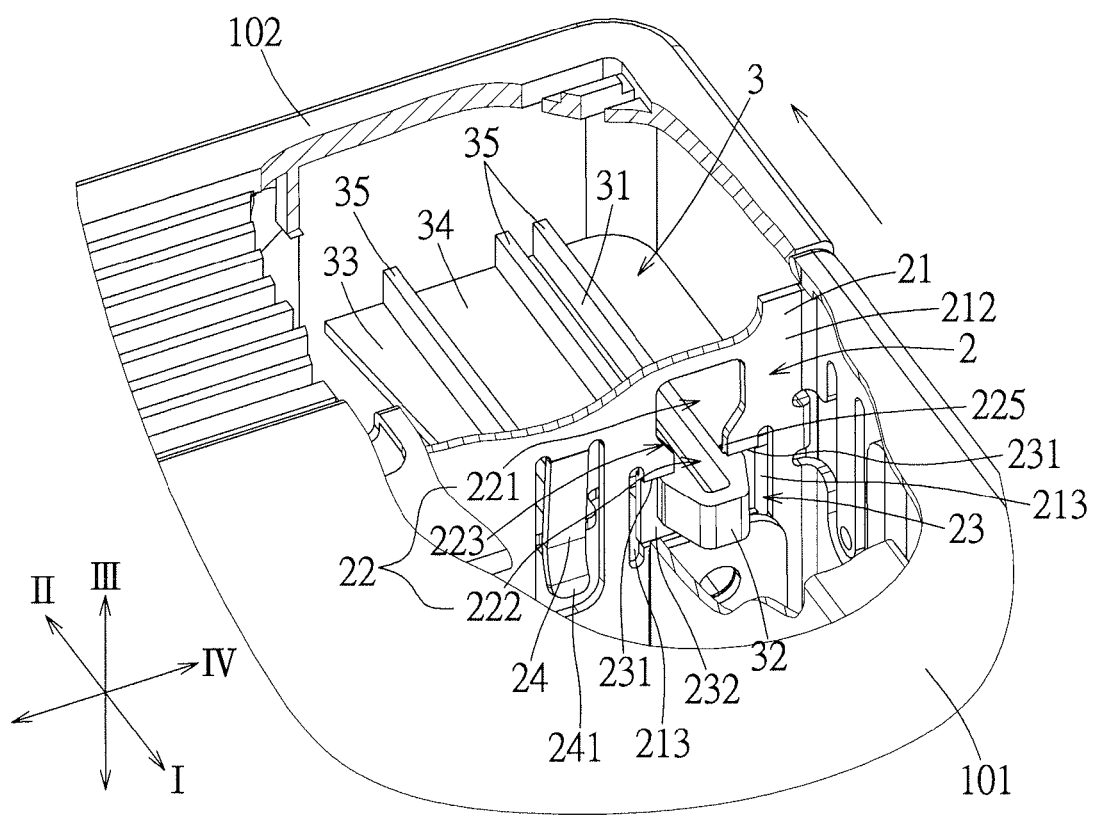
FIG. 12 is a fragmentary partly-cutaway perspective view illustrating the second securing unit being engaged with the first securing unit.
Figure 13:
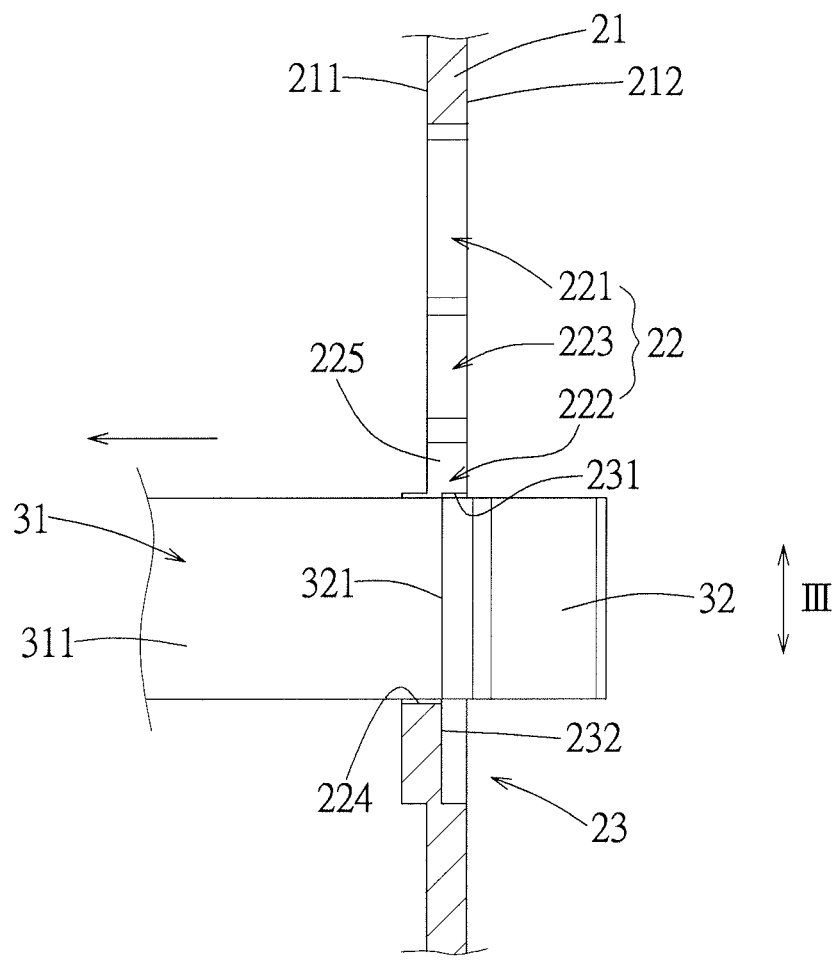
FIG. 13 is a fragmentary, partly-sectional view illustrating the operation of FIG. 12.

As shown in FIGS. 12 and 13, after the portion of the extending part 31 is moved to abut against the abutting edge 224 and the side edges 225, the second component 102 is released (for example, by the user). The biasing force generated by the biasing structure 24 in turn biases the pressing structure 33 in the second direction (II). As a result, the head part 32 is moved into and engages the limiting structure 23, which is in the form of a recess. The pair of stepped structures 231 now abut against the head part 32, and upward movement of the second component 102 in the third direction (III) can be prohibited (that is, the extending part 31 is unable to move back to the insertion part 221). Furthermore, due to the engagement of the head part 32 and the limiting structure 23, the second abutting surface 232 abuts against the first abutting surface 321 for prohibiting movement of the second component 102 in the second direction (II).

To this point, the first securing unit 2 and the second securing unit 3 cooperate to secure the second component 102 to the first component 101, and prevent movement of the second component 102 in all directions relative to the first component 101. Specifically, the biasing structure 24 and the second abutting surface 232 cooperate to prevent movement of the second component 102 in the second direction (II), the abutting edge 224 and the first abutting surface 231 prevent movement of the second component 102 in the third direction (III), and the side edges 225 prevents movement of the second component 102 in the fourth direction (IV). It can be seen that, when employing such a mechanism for securing, no additional component is required to position the second component 102 with respect to the first component 101 (e.g., the positioning through hole 132 and the positioning member 134 of the conventional mechanism).

It is noted that, in this embodiment, the biasing structure 24 has a connecting end that is fixedly connected to the fixture board 21, and a distal end that is opposite to the connecting end in the third direction (III). More specifically, the connecting end is in proximity of the insertion part 221. The distal end is bent away from the fixture board 21 in the first direction (I) to form a bent part 241. One purpose of such a configuration is that, as shown in FIG. 9, once the extending part 31 is disposed at the engaging part 222 of the engaging through hole 22, the pressing structure 33 will press upwardly the biasing structure 24 and the connecting end of the biasing structure 24 will provide a relatively large biasing force to the pressing structure 33 if the extending part 31 is undesiredly moved from the engaging part 222 toward the insertion part 221. Therefore, a component of the biasing force applied to the pressing structure 33 is directed in the third direction (III), further ensuring that an external impact does not move the extending part 31 back into the insertion part 221 (and subsequently detaching the second component 102 from the first component 101). The bent part 241 of the biasing structure 24 eliminates contact between the distal end of the biasing structure 24, which may have a sharp edge, and fingers of the user, and subsequently prevents possible injury to the fingers attributed to the sharp edge of the distal end.

When it is to detach the second component 102 from the first component 101, first, the second component 102 is pushed (for example, by the user) in the first direction (I). When pushed by a force large enough to overcome the biasing force provided by the biasing structure 24, the head part 32 moves in the first direction (I) to disengage from the limiting structure 23 (as shown in FIG. 11). Then, the second component 102 is moved upwardly (for example, by the user) in the third direction (III). As a result, the extending part 31 is moved from the engaging part 222 to the insertion part 221 (as shown in FIG. 7). Afterward, the second component 102 is moved (for example, by the user) in the second direction (II). Accordingly, the extending part 31 and the head part 32 are removed from the engaging through hole 22, thus detaching the second component 102 from the first component 101 (as shown in FIG. 4).

Figure 1:
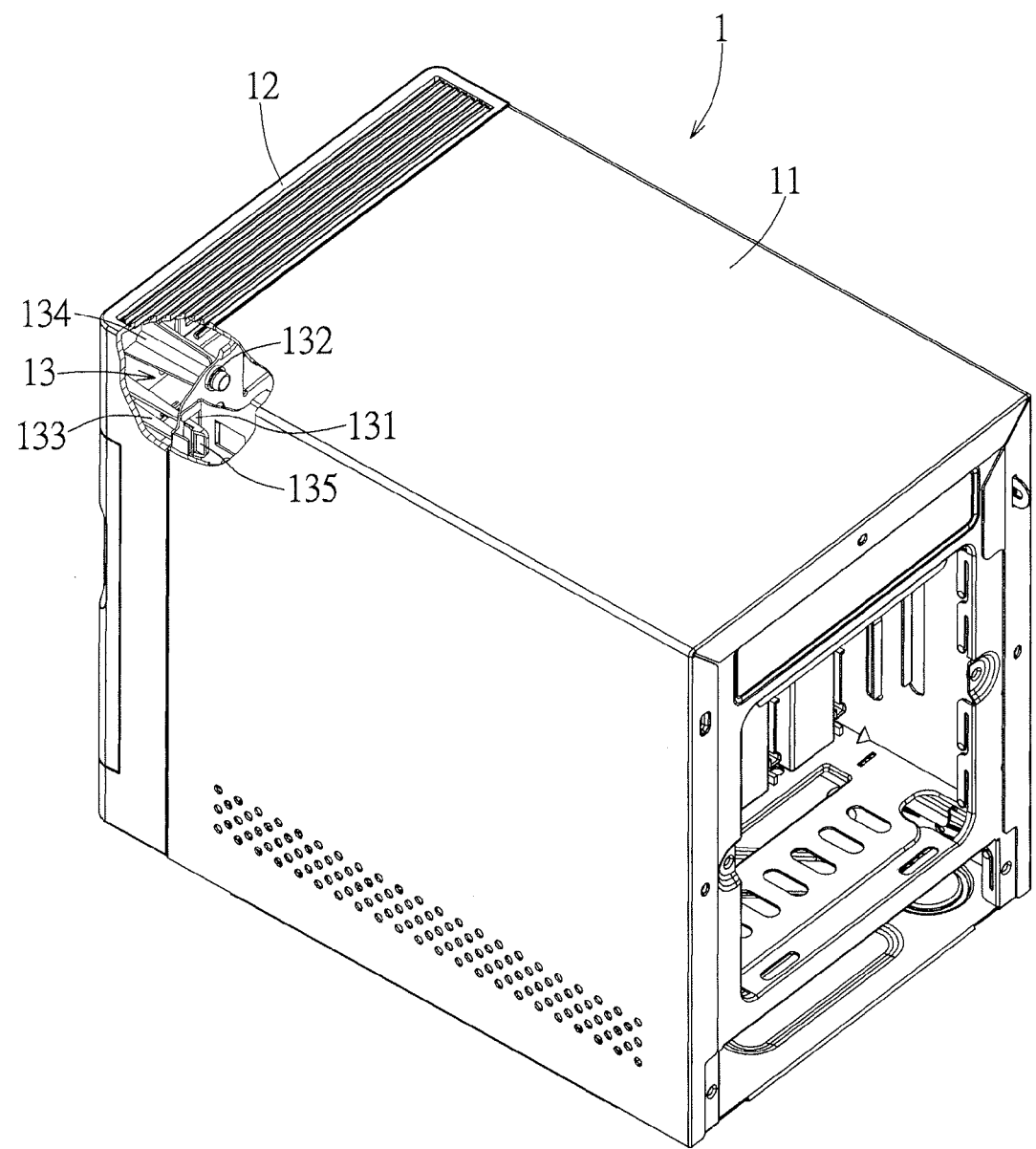
FIG. 1 is a partly-cutaway perspective view of a conventional electronic device case and a securing mechanism thereof.

In brief, this invention has the following advantages. When engaged with the first securing unit 2, the second securing unit 3 is secured in all directions by the first securing unit 2. Therefore, the second component 102 is firmly secured to the first component 101, and the assembled electronic device case is highly resistant to external impacts that may otherwise undesirably detach the plastic panel 12 of the conventional electronic device case from the metal housing 11 (see FIG. 1). The second securing unit 3 is fixedly disposed on the second component 102, and therefore can be easily driven by the second component 102 to move in a desired direction. Such a configuration eliminates the need to operate from inside the electronic device case in order to disengage the second component 102.

In embodiments, the electronic device case may comprise a plurality of the securing mechanisms 100. The second securing units 3 of the plurality of the securing mechanisms 100 may be fixedly disposed on various parts of the second component 102, thereby being enabled to be simultaneously driven to move by the movement of the second component 102. This eliminates the need to detach each pair of the first securing unit 2 and the second securing unit 3 separately.

In embodiments, the engagement of the second securing unit 3 and the engaging through hole 22 does not involve deforming the second securing unit 3. Therefore, the second securing units 3 can be more durable, with a lower chance of fracture.

While the present invention has been described in connection with what is considered the most practical and embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A securing mechanism for use with a first component and a second component, said securing mechanism being configured to removably secure the second component to the first component, said securing mechanism comprising:
   a first securing unit to be fixedly disposed on the first component, and including
      a fixture board to be fixedly attached to the first component, having a first surface that faces the second component in use and a second surface that is opposite to said first surface, and formed with an engaging through hole that has an insertion part and an engaging part in spatial communication with each other, said engaging part having a width smaller than that of said insertion part,
      a limiting structure formed on said second surface of said fixture board, and
      a biasing structure; and
   a second securing unit to be fixedly disposed on the second component and including
      an extending part to extend from the second component in a first direction, and having a width that corresponds with that of said engaging part of said engaging through hole, and
      a head part disposed on a distal end of said extending part and having a width larger than the width of said engaging part and smaller than that of said insertion part;
   wherein, when said extending part extends through said insertion part of said engaging through hole and is inserted into said engaging part of said engaging through hole, said biasing structure biases said second securing unit in a second direction opposite to the first direction and away from the first component, and said head part engages said limiting structure, thereby limiting movement of said head part in a direction toward said insertion part.

2. The securing mechanism of claim 1, wherein said limiting structure has a pair of stepped structures each disposed at a respective one of opposite sides of said engaging part.

3. The securing mechanism of claim 2, wherein:
   said insertion part and said engaging part of said engaging through hole spatially communicate with each other in a third direction perpendicular to the first and second directions; and
   said engaging part defines an abutting edge at an end distal from said insertion part, said abutting edge being perpendicular to the first direction and parallel with said stepped structures.

4. The securing mechanism of claim 3, wherein said engaging part of said engaging through hole further defines a pair of parallel side edges extending in the third direction, said extending part having a pair of side surfaces for abutting respectively against said side edges.

5. The securing mechanism of claim 1, wherein said limiting structure has a first abutting surface parallel to said fixture board, said head part has a second abutting surface proximate to and confronting said extending part, and said second abutting surface abutting against said first abutting surface when said head part engages said limiting structure.

6. The securing mechanism of claim 1, wherein said limiting structure is a recess formed in said second surface.

7. The securing mechanism of claim 1, wherein:
   said insertion part and said engaging part of said engaging through hole spatially communicate with each other in a third direction perpendicular to the first and second directions; and
   said biasing structure is a spring plate that extends in the third direction, and is spaced apart from said engaging through hole in a fourth direction perpendicular to the first, second and third directions.

8. The securing mechanism of claim 7, wherein said biasing structure has a connecting end that is fixedly connected to said fixture board, and a distal end that is opposite to said connecting end in the third direction and that is bent away from of said fixture board in the first direction.

9. The securing mechanism of claim 1, wherein said second securing unit further includes a pressing structure that is to extend from the second component in the first direction, and that is configured to be biased by said biasing structure.

10. The securing mechanism of claim 9, wherein, said second securing unit further includes an enforcing board that interconnects said extending part and said pressing structure, and at least one of said extending part and said pressing structure includes a plurality of enforcing ribs extending in the first direction.

11. The securing mechanism of claim 1, wherein said fixture board is formed with a pair of grooves penetrating therethrough at opposite sides of said engaging part, respectively.

12. An electronic device case comprising a first component, a second component, and at least one securing mechanism for removably securing said second component to said first component in a first direction, said securing mechanism including:
   a first securing unit fixedly disposed on said first component, and including
      a fixture board fixedly attached to said first component, having a first surface that faces said second component and a second surface that is opposite to said first surface, and formed with an engaging through hole that has an insertion part and an engaging part in spatial communication with each other, said engaging part having a width smaller than that of said insertion part,
      a limiting structure formed on said second surface of said fixture board, and
      a biasing structure; and
   a second securing unit fixedly disposed on said second component and including
      an extending part extending from said second component in the first direction, and having a width that corresponds with that of said engaging part of said engaging through hole, and
      a head part disposed on a distal end of said extending part and having a width larger than the width of said engaging part and smaller than that of said insertion part;
   wherein, when said extending part extends through said insertion part of said engaging through hole and is inserted into said engaging part of said engaging through hole, said biasing structure biases said second securing unit in a second direction opposite to the first direction and away from said first component, and said head part engages said limiting structure, thereby limiting movement of said head part in a direction toward said insertion part.

13. The electronic device case of claim 12, wherein said limiting structure has a pair of stepped structures each disposed at a respective one of opposite sides of said engaging part.

14. The electronic device case of claim 13, wherein:
said insertion part and said engaging part of said engaging through hole spatially communicate with each other in a third direction perpendicular to the first and second directions; and
said engaging part defines an abutting edge at an end distal from said insertion part, said abutting edge being perpendicular to the first direction and parallel with said stepped structures.

15. The electronic device case of claim 14, wherein said engaging part of said engaging through hole further defines a pair of parallel side edges extending in the third direction, said extending part has a pair of side surfaces for abutting respectively against said side edges.

16. The electronic device case of claim 12, wherein said limiting structure has a first abutting surface parallel to said fixture board, said head part has a second abutting surface proximate to and confronting said extending part, and said second abutting surface abuts against said first abutting surface when said head part engages with said limiting structure.

17. The electronic device case of claim 12, wherein said limiting structure is a recess formed in said second surface.

18. The electronic device case of claim 12, wherein:
said insertion part and said engaging part of said engaging through hole spatially communicate with each other in a third direction perpendicular to the first and second directions; and
said biasing structure is a spring plate that extends in the third direction, and is spaced apart from said engaging through hole in a fourth direction perpendicular to the first, second and third directions.

19. The electronic device case of claim 18, wherein said biasing structure has a connecting end that is fixedly connected to said fixture board, and a distal end that is opposite to said connecting end in the third direction and that is bent away from of said fixture board in the first direction.

20. The electronic device case of claim 12, wherein said second securing unit further includes a pressing structure that extends from said second component in the first direction, and that is configured to be biased by said biasing structure.

21. The electronic device case of claim 20, wherein said second securing unit further includes an enforcing board that interconnects said extending part and said pressing structure, and at least one of said extending part and said pressing structure includes a plurality of enforcing ribs extending in the first direction.

22. The electronic device case of claim 12, wherein said fixture board is formed with a pair of grooves penetrating therethrough at opposite sides of said engaging part, respectively.

\* \* \* \* \*